(12) United States Patent
Breyer et al.

(10) Patent No.: US 7,568,172 B2
(45) Date of Patent: Jul. 28, 2009

(54) INTEGRATION OF PRE-DEFINED FUNCTIONALITY AND A GRAPHICAL PROGRAM IN A CIRCUIT

(75) Inventors: John R. Breyer, Austin, TX (US); Kosta Ilic, Austin, TX (US); Ryan H. Brown, Austin, TX (US)

(73) Assignee: National Instruments Corporation, Austin, TX (US)

( * ) Notice: Subject to any disclaimer, the term of this patent is extended or adjusted under 35 U.S.C. 154(b) by 50 days.

(21) Appl. No.: 11/833,667

(22) Filed: Aug. 3, 2007

(65) Prior Publication Data

US 2009/0037863 A1 Feb. 5, 2009

(51) Int. Cl.
*G06F 17/50* (2006.01)

(52) U.S. Cl. ............................................. 716/1; 716/17

(58) Field of Classification Search ...................... 716/1, 716/8–10, 17
See application file for complete search history.

(56) References Cited

U.S. PATENT DOCUMENTS

| | | | |
|---|---|---|---|
| 6,584,601 B1 * | 6/2003 | Kodosky et al. ............... 716/4 |
| 7,451,423 B1 * | 11/2008 | Reynolds et al. ............. 716/16 |
| 7,472,370 B1 * | 12/2008 | Reynolds et al. ............. 716/17 |
| 2003/0163298 A1 | 8/2003 | Odom et al. |
| 2005/0258517 A1 | 11/2005 | Oberlaender et al. |

* cited by examiner

*Primary Examiner*—Jack Chiang
*Assistant Examiner*—Binh C Tat
(74) *Attorney, Agent, or Firm*—Meyertons Hood Kivlin Kowert & Goetzel, P.C.; Jeffrey C. Hood; Mark S. Williams

(57) ABSTRACT

System and method for designing a circuit. At least one graphical program comprising a plurality of interconnected nodes that visually indicate functionality of the graphical program is selected in response to user input. At least one pre-defined hardware configuration program (HCP) is selected from a plurality of pre-defined HCPs in response to user input, where the selected at least one pre-defined HCP specifies a fixed functionality, including interface functionality for communicating with the at least one graphical program when implemented on the circuit. At least a portion of a netlist is generated based on the at least one graphical program and the at least one selected pre-defined HCP, where the netlist is usable to configure a circuit, wherein a first portion of the circuit implements the functionality of the graphical program and a second portion of the circuit implements the fixed functionality.

19 Claims, 10 Drawing Sheets

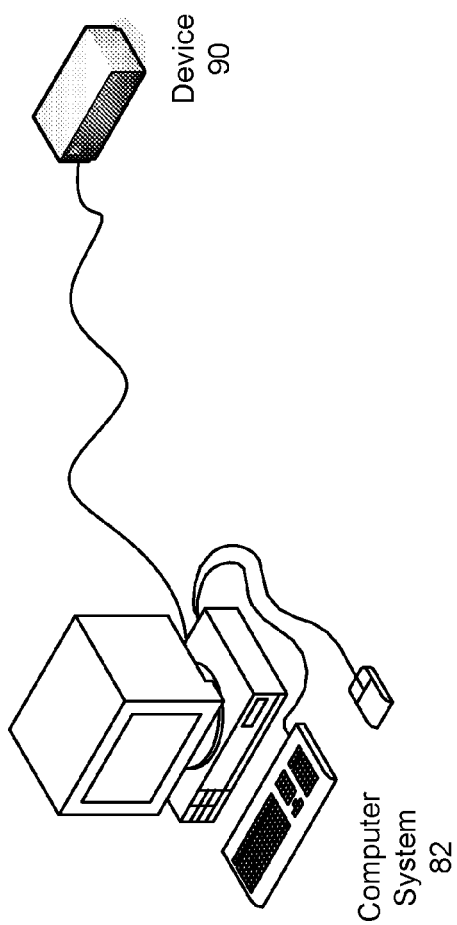
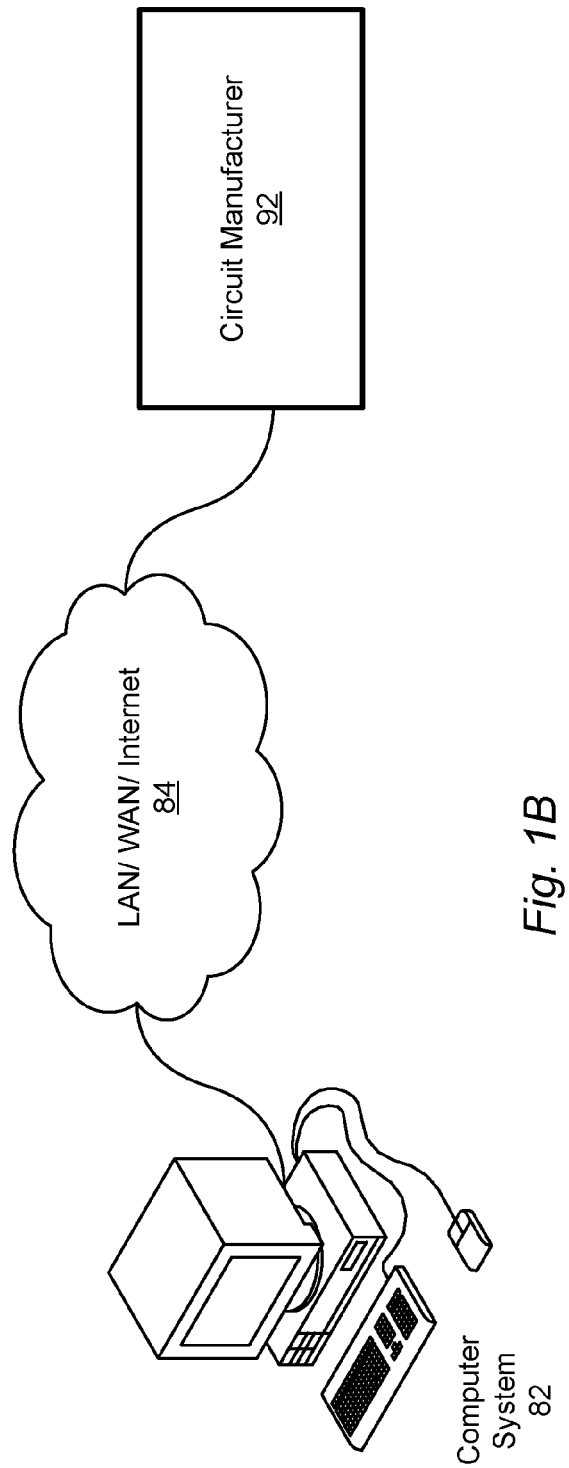
Fig. 1A
Fig. 1B

INTEGRATION OF PRE-DEFINED FUNCTIONALITY AND A GRAPHICAL PROGRAM IN A CIRCUIT

FIELD OF THE INVENTION

The present invention relates to the field of circuit design, and more specifically, to integration of pre-defined functionality and a graphical program in a circuit.

DESCRIPTION OF THE RELATED ART

Many systems and devices, e.g., measurement, automation, and control systems and devices, among others, include functionality implemented in custom circuitry, e.g., on or in programmable hardware elements, such as field programmable gate arrays (FPGAs), or application specific integrated circuits (ASICs).

Graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

Some current development systems for specifying circuit design allow users to specify desired functionality of the circuit via user-defined programs. For example, LabVIEW FPGA, also provided by National Instruments Corporation, allows users to specify functionality for, and configure, programmable hardware elements, and specifically facilitate design and deployment of user-defined programs to the programmable hardware element. However, in some applications, users may wish to incorporate pre-defined functionality along with user-defined graphical program functionality in the design of the circuit, which is not currently supported by development systems.

Thus, improved systems and methods for designing circuits are desired.

SUMMARY OF THE INVENTION

Various embodiments of a system and method for designing a circuit are presented.

At least one graphical program may be selected in response to user input, where the at least one graphical program includes a plurality of interconnected nodes that visually indicate functionality of the at least one graphical program. The at least one graphical program may implement any functionality desired. Examples of functionality of the at least one graphical program are provided below.

At least one pre-defined hardware configuration program (HCP) may be selected from a plurality of pre-defined HCPs in response to user input, where the selected at least one pre-defined HCP specifies a fixed functionality, including interface functionality for communicating with the at least one graphical program when implemented on the circuit. For example, the hardware configuration program may be in a hardware description language (HDL), although any other type of hardware configuration program may be used as desired. Examples of standard HDLs include VHDL (VHSIC (Very-High-Speed Integrated Circuit) HDL) and Verilog HDL. In some embodiments, the HCP may be generated based on some other representation of the functionality. For example, the functionality may be designed and implemented in graphical programming language, such as the "G" language of the LabVIEW graphical program development environment, provided by National Instruments Corporation, and converted to the HCP. Note that any other languages may be used as desired, e.g., JAVA™, C, C++, VISUAL BASIC™, and so forth. Such pre-defined HCPs implementing various functionalities may be referred to as "IP cores" (intellectual property cores).

In various embodiments, the plurality of pre-defined HCPs (and possibly a plurality of graphical programs from which the at least one graphical program may be selected) may be stored in the form of a library, or may be stored in a database. In one embodiment, a GUI may be provided for browsing or searching the HCPs. For example, the HCPs may be searchable by functionality, where a user may provide search terms that describe a desired functionality, and may be presented one or more HCPs related to that functionality from which the user may select the at least one HCP for use. In another embodiment, the HCPs may be organized by functionality, and the user may browse or navigate through one or more hierarchies of HCPs based on descriptive names or functional descriptions of the programs, e.g., via a hierarchical menu system or directory structure. In some embodiments, each HCP may be represented by an icon, e.g., in a palette, or a system of hierarchical palettes, from which the user may select the desired HCP, e.g., by dragging and dropping the icon onto a diagram representing the circuit.

Thus, the user may select at least one graphical program and at least one HCP (e.g., IP core) specifying or implementing desired functionality for a circuit, such as a programmable hardware element or an ASIC.

At least a portion of a netlist may then be generated based on based on the at least one graphical program and the at least one selected pre-defined HCP. For example, the at least one graphical program and the at least one selected pre-defined HCP may be compiled to generate the netlist, e.g., using a logic compiler or other tools. The netlist may be usable to configure a circuit, where a first portion of the circuit implements the functionality of the graphical program and a second portion of the circuit implements the fixed functionality (of the at least one HCP).

In one embodiment, the circuit may include or be a programmable hardware element that includes a programmable gate array, e.g., an FPGA. The programmable hardware element may be configured based on the netlist to produce a configured programmable hardware element, where the configured programmable hardware element implements the functionality of the at least one graphical program and a second portion of the configured programmable hardware element implements the fixed functionality. During operation of the configured programmable hardware element the first portion of the configured programmable hardware element may perform the functionality of the graphical program, and the second portion of the configured programmable hardware element may perform the fixed functionality.

In one embodiment, the configured programmable hardware element may include a processor (e.g., configured or manufactured on the element). During operation of the configured programmable hardware element the configured programmable hardware element may be operable to receive commands from the processor and perform operations based on the commands. Similarly, as indicated above, the programmable hardware element may be coupled to a processor and memory, and may operate in conjunction with the processor, e.g., performing operations in response to commands from the processor.

Alternatively (or in addition), in some embodiments, e.g., where the circuit is or includes an ASIC, the netlist may be send to a circuit manufacturer to manufacture the ASIC, where the ASIC implements the functionality of the at least one graphical program and the at least one HCP.

Note that in some embodiments, the user may add or specify additional functionality to be encoded in the netlist, e.g., prior to configuring the programmable hardware element or sending the netlist to the manufacturer. In other words, in addition to selecting the at least one graphical program and the at least one HCP, both of which may have pre-defined functionality, the user may further specify "custom" functionality to include in the circuit, such as additional components or circuit elements, and/or additional operations. Similarly, in some embodiments, the user may edit the at least one graphical program prior to generation of the netlist, e.g., to customize the program to suit the particular needs of the user. Note also that in some embodiments, the user may actually develop the at least one graphical program, e.g., in an editor, and then may select the program for use, as described above.

As noted above, the at least one graphical program may implement any functionality desired. For example, in one embodiment, the at least one graphical program may implement interface functionality for communicating with a host interface executing on a processor coupled to the circuit, where during operation of the circuit, the first portion of the circuit may be operable to communicate with the host interface. Note that as used herein, a host interface refers to a set of functions that allows the circuit and a host processor to talk to each other. For example, in an FPGA embodiment, the host interface may allow an application executing on the host processor to read and write registers that are also accessible from the FPGA fabric, i.e., from the circuit configured on the FPGA, this being but one example of such interface functionality.

In another embodiment, the at least one graphical program may implement interface functionality for communicating with an I/O element coupled to the first portion of the circuit, and where during operation of the circuit, the first portion of the circuit is operable to communicate with the I/O element. For example, in one exemplary embodiment, the at least one graphical program may contain graphical elements, e.g., nodes, whose functionality is to read data from an analog to digital converter (ADC), write data to a digital to analog converter (DAC), and/or read and write data to/from digital lines. Of course, any other I/O interface functionality may be used as desired.

In other embodiments, the at least one graphical program may implement data or signal processing, analysis, generation, or acquisition functionality, among others. Thus, the at least one graphical program may implement any functionality desired.

Similarly, in various embodiments, the HCP may implement any functionality desired, e.g., the HCP may implement various interfaces, e.g., for the graphical program and/or for systems or components coupled to the circuit. For example, in one embodiment, the selected at least one pre-defined HCP may be configured to implement an interface for a software application executing on a processor coupled to the circuit, where during operation of the circuit, the interface may provide an application interface for the software application. For example, in one exemplary embodiment, an HCP may provide or implement a set of registers for interfacing with a data acquisition (DAQ) device driver, thus allowing the software application to talk to the HCP (portion of the circuit) through an existing API of the DAQ device driver. Of course, any other interface functionality may be implemented by the HCP as desired.

In another embodiment, the selected at least one pre-defined HCP may be configured to implement an input/output (I/O) interface for an I/O element coupled to the second portion of the circuit, where during operation of the circuit, the I/O interface may provide an interface for the I/O element. For example, in one exemplary embodiment, the HCP may include or specify logic implementing a counter by reading and writing to digital I/O lines, this being but one example of such an I/O interface.

In a further embodiment, the selected at least one pre-defined HCP may be configured to implement a data acquisition function, where during operation of the circuit, the second portion of the circuit may be operable to perform the data acquisition function to acquire data from a physical system. For example, in one exemplary embodiment, the HCP may include or specify logic to sample an ADC at a specified rate in order to acquire a waveform.

In yet another embodiment, the selected at least one pre-defined HCP may be configured to implement a data analysis function, where during operation of the circuit, the second portion of the circuit is operable to perform the data analysis function. In one embodiment, the at least one graphical program may specify or implement a data acquisition function, where during operation of the circuit, the first portion of the circuit is operable to perform the data acquisition function to acquire data from a physical system. Note that as used herein, the term "data analysis" may include data processing, e.g., data filtering, transformation, or otherwise manipulating data or signals.

In some embodiments, the first and second portions of the circuit may operate conjunctively or cooperatively to perform some desired task or operations. For example, in one embodiment, the at least one graphical program may specify a data analysis function, and the selected at least one pre-defined HCP may be configured to implement a data acquisition function, where during operation of the circuit, the first portion of the circuit is operable to analyze data acquired by the second portion of the circuit. Conversely, the at least one graphical program may specify a data acquisition function, and the selected at least one pre-defined HCP may be configured to implement a data analysis function, where during operation of the circuit, the second portion of the circuit may be operable to analyze data acquired by the first portion of the circuit.

Note that these functionalities and interfaces are meant to be exemplary, and that any other types of interface and functionalities may be implemented as desired.

For example, in one embodiment, the fixed functionality (of the HCP) may include timing and data transfer functionality for the at least one graphical program functionality implemented on the first portion of the circuit, for a software application executing on a processor coupled to the circuit, and/or for an I/O element coupled to the second portion of the circuit. For example, in one exemplary embodiment, the software application may specify channels from which to acquire data, as well as the rate at which to acquire the data. Channels coupled to the HCP portion of the circuit may then be sampled according to the predefined HCP functionality and sent to the software application by the predefined HCP data transfer functionality. The HCP portion of the circuit may also send its timing information to the graphical program portion of the circuit, and this timing information may be used to sample the channels coupled to the graphical program portion of the circuit at the specified rate. The data from the graphical program portion of the circuit may then be sent to the software application, also by the predefined HCP data transfer functionality. Thus, the HCP functionality may implement and manage timing and data transfer operations for portions of the circuit and/or for external entities coupled to the circuit.

In one embodiment, the interface functionality may be configurable, e.g., after the at least one HCP has been selected. For example, user input may be received (via a GUI) configuring one or more aspects of the interface functionality for communicating with the graphical program functionality implemented on the first portion of the circuit. Generating the at least a portion of the netlist may then be performed in accordance with the configuration of the one or more aspects. For example, in one exemplary embodiment, the selected HCP may be configured to send a specific type and quantity of data from the graphical program. For example, if the graphical program is configured to acquire two channels of data, where each channel is 16 bits wide, and to utilize the HCP's data transfer functionality to transfer data to the software application, the HCP interface may be configured to accept two separate 16-bit data points. Of course, this is but one exemplary interface functionality, and any others may be used as desired.

In preferred embodiments, the above method may be performed via a graphical user interface. For example, the method may include displaying a graphical user interface on a display, where selecting at least one the graphical program and selecting the at least one pre-defined HCP includes receiving user input adding the at least one graphical program and the selected at least one pre-defined HCP to a portion of the graphical user interface (GUI). The user may make these selections via any of a number of GUI techniques. For example, in one embodiment, a tree structure may be displayed on a display, e.g., a computer monitor, and selecting the at least one graphical program and selecting the at least one pre-defined HCP may include receiving user input adding the at least one graphical program and the at least one pre-defined HCP to the tree structure. In other words, the tree structure may operate as a GUI for configuring the circuit design. In one embodiment, receiving user input adding the at least one graphical program and the selected at least one pre-defined HCP to the tree structure may include one or more of: receiving user input dragging and dropping respective icons representing the at least one graphical program and the selected at least one pre-defined HCP onto the tree structure, or receiving user input to the tree structure invoking a menu, and receiving user input to the menu selecting the at least one graphical program and the at least one pre-defined HCP from the menu.

As another example, the method may include displaying a GUI on a display, where the GUI includes an image of the circuit. Selecting the at least one graphical program and selecting the at least one pre-defined HCP may include receiving user input adding icons representing the at least one graphical program and the selected at least one pre-defined HCP to the image of the circuit, as mentioned above. For example, the icons may be selected from a palette or a set of palettes. Of course, any other selection means may be used as desired.

BRIEF DESCRIPTION OF THE DRAWINGS

A better understanding of the present invention can be obtained when the following detailed description of the preferred embodiment is considered in conjunction with the following drawings, in which:

FIG. 1A illustrates a computer system coupled to a programmable hardware element, according to an embodiment of the present invention;

FIG. 1B illustrates a computer system communicatively coupled to a circuit manufacturer, according to an embodiment of the present invention;

Figure 2A:
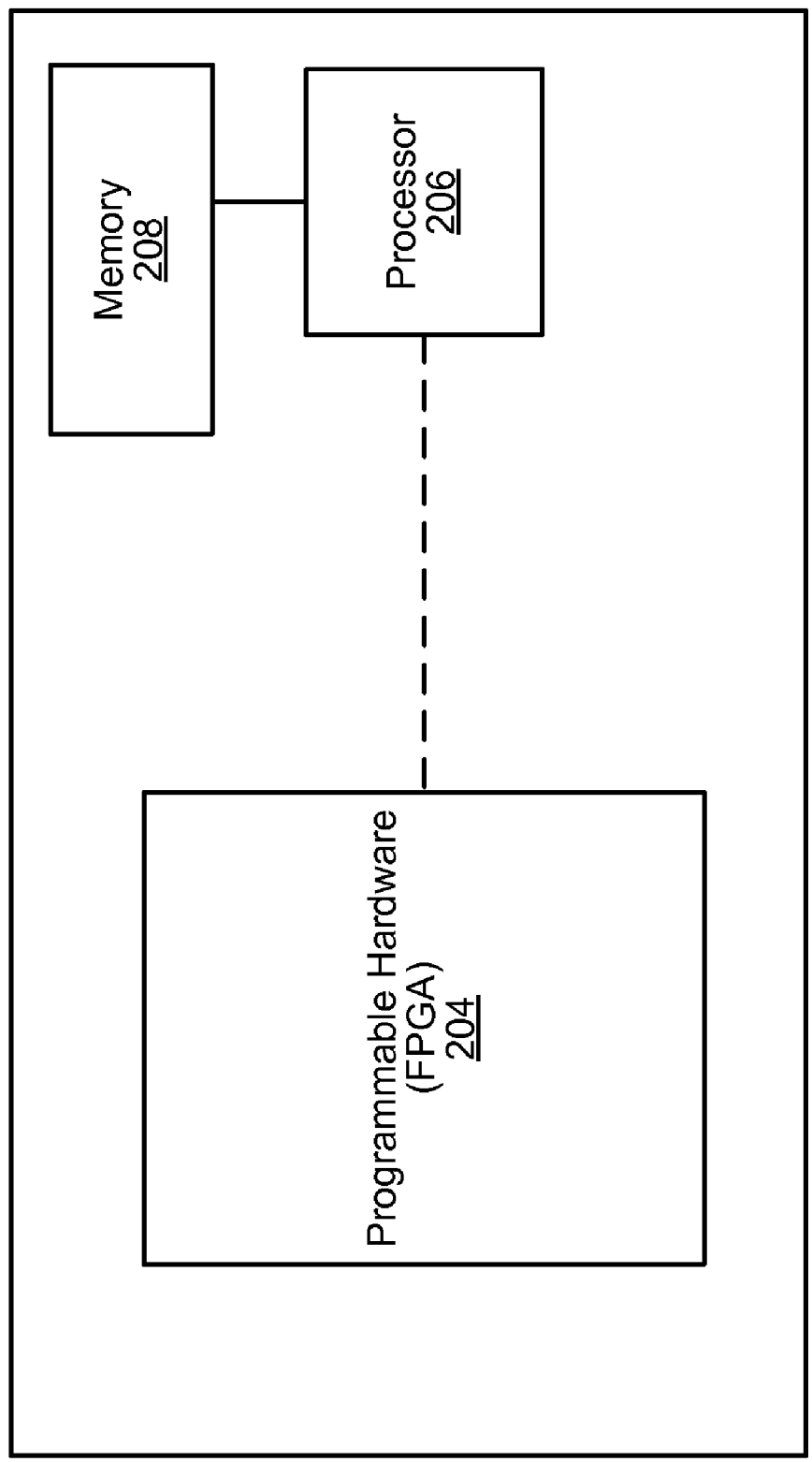
FIG. 2A is a high-level block diagram of a programmable hardware element coupled to a controller, according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Incorporation by Reference

The following references are hereby incorporated by reference in their entirety as though fully and completely set forth herein:

U.S. Pat. No. 6,981,086 titled "Instrumentation System Including a Backplane Having a Switched Fabric Bus and Instrumentation Lines," issued on Dec. 27, 2005.

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

PXI-1 Hardware Specification Rev 2.2, Sep. 22, 2004, available from PXI Systems Alliance.

PXI-1 Hardware Specification Rev 2.2 ECN-1, May 12, 2005, available from PXI Systems Alliance.

PXI-6 PXI Express Software Specification, Sep. 1, 2005, available from PXI Systems Alliance.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected blocks or icons, wherein the plurality of interconnected blocks or icons visually indicate functionality of the program.

The following provides examples of various aspects of graphical programs. The following examples and discussion are not intended to limit the above definition of graphical program, but rather provide examples of what the term "graphical program" encompasses:

The blocks in a graphical program may be connected in one or more of a data flow, control flow, and/or execution flow format. The blocks may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks are often referred to as the block diagram portion of the graphical program.

Block—In the context of a graphical program, an element that may be included in a graphical program. A block may have an associated icon that represents the block in the graphical program, as well as underlying code or data that implements functionality of the block. Exemplary blocks include function blocks, sub-program blocks, terminal blocks, structure blocks, etc. Blocks may be connected together in a graphical program by connection icons or wires.

The blocks in a graphical program may also be referred to as graphical program nodes or simply nodes.

Graphical Data Flow Program (or Graphical Data Flow Diagram)—A graphical program or diagram comprising a plurality of interconnected blocks, wherein at least a subset of the connections among the blocks visually indicate that data produced by one block is used by another block. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input the by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Subset—in a set having N elements, the term "subset" comprises any combination of one or more of the elements, up to and including the full set of N elements. For example, a subset of a plurality of icons may be any one icon of the plurality of the icons, any combination of one or more of the icons, or all of the icons in the plurality of icons. Thus, a subset of an entity may refer to any single element of the entity as well as any portion up to and including the entirety of the entity.

FIGS. 1A and 1B—A Computer-Implemented System

FIG. 1A illustrates a computer system 82 coupled via a transmission medium to a configurable or programmable device 90, i.e., a device that includes circuit according to one embodiment of the present invention, e.g., a programmable hardware element, such as a field programmable gate array (FPGA), or an application specific integrated circuit (ASIC), as described below in more detail, where the computer system 82 is configured to implement some embodiments of the present invention. As shown in FIG. 1A, the computer system 82 may include a display device, e.g., operable to display a graphical user interface for configuring or programming the device 90. In various embodiments, the graphical user interface may comprise any type of graphical user interface, e.g., depending on the computing platform.

The computer system 82 preferably includes at least one memory medium on which one or more computer programs or software components according to one embodiment of the present invention may be stored. For example, the memory medium may store various software programs, e.g., graphical programs, wizards, or other development or configuration tools, that are executable to perform the methods described herein. As one example, the memory medium may include a utility program that executes to generate a hardware configuration program (e.g., an HDL program), e.g., from a specification or program, and/or to create a netlist from a specification or a program, e.g., a graphical program or a hardware configuration program. As another example, the memory medium may store a program that operates to configure a programmable hardware element based on a netlist, or to send the netlist to a circuit manufacturer to implement a circuit based on the netlist. Additionally, the memory medium may store a development environment application, such as a graphical program development environment, used to create and/or execute such specifications or programs, described below in more detail.

As will be discussed below, in preferred embodiments, the memory medium (or a memory medium coupled to the computer system 82) may store a set, e.g., database or library, of pre-defined hardware configuration programs (HCPs) implementing respective IP cores, i.e., fixed or pre-defined functionalities targeted for implementation on a circuit, such as an ASIC, or a programmable hardware element, that may be selected for inclusion in a hardware configuration program for the circuit, e.g., the programmable hardware element or ASIC, e.g., for interfacing between application software, e.g., controller engines executing on a host controller (or host computer system), and I/O (e.g., I/O components or systems) in accordance with specified protocols, for data or signal processing or analysis, and so forth, as desired. The memory medium may also store operating system software, as well as other software for operation of the computer system. It should be noted that while FIG. 1A illustrates a single computer system coupled to the device, in other embodiments, the computer system may comprise a plurality of networked computers, servers, storage area networks (SANs), and so forth, as desired.

FIG. 1B illustrates an embodiment where the computer system 82 is coupled through a network 84, e.g., a Local Area Network (LAN), a Wide Area Network (WAN), or the Internet, to a circuit manufacturer 92. As described above with reference to FIG. 1A, the computer system 82 may store various software programs to perform embodiments of the present invention, e.g., a utility program that executes to generate a hardware configuration program (e.g., an HDL program), e.g., from a specification or program, and/or to create a netlist from a specification or a program, e.g., a graphical program or a hardware configuration program, and possibly a development environment application, such as a graphical program development environment, used to create and/or execute such specifications or programs. As also noted above, the computer system may store or have access to a set of pre-defined hardware configuration programs (HCPs) implementing respective IP cores, i.e., fixed or pre-defined functionalities for use in designing and implementing circuits.

In the embodiment of FIG. 1B, rather than deploying the netlist to a programmable hardware element, the computer system may be configured to send the netlist (e.g., via the network 84) to a circuit manufacturer 92 as a specification for a circuit, e.g., an ASIC. The circuit manufacturer 92 may then create or configure a circuit, e.g., the ASIC, according to the netlist, as will be described in more detail below.

Figure 2B:
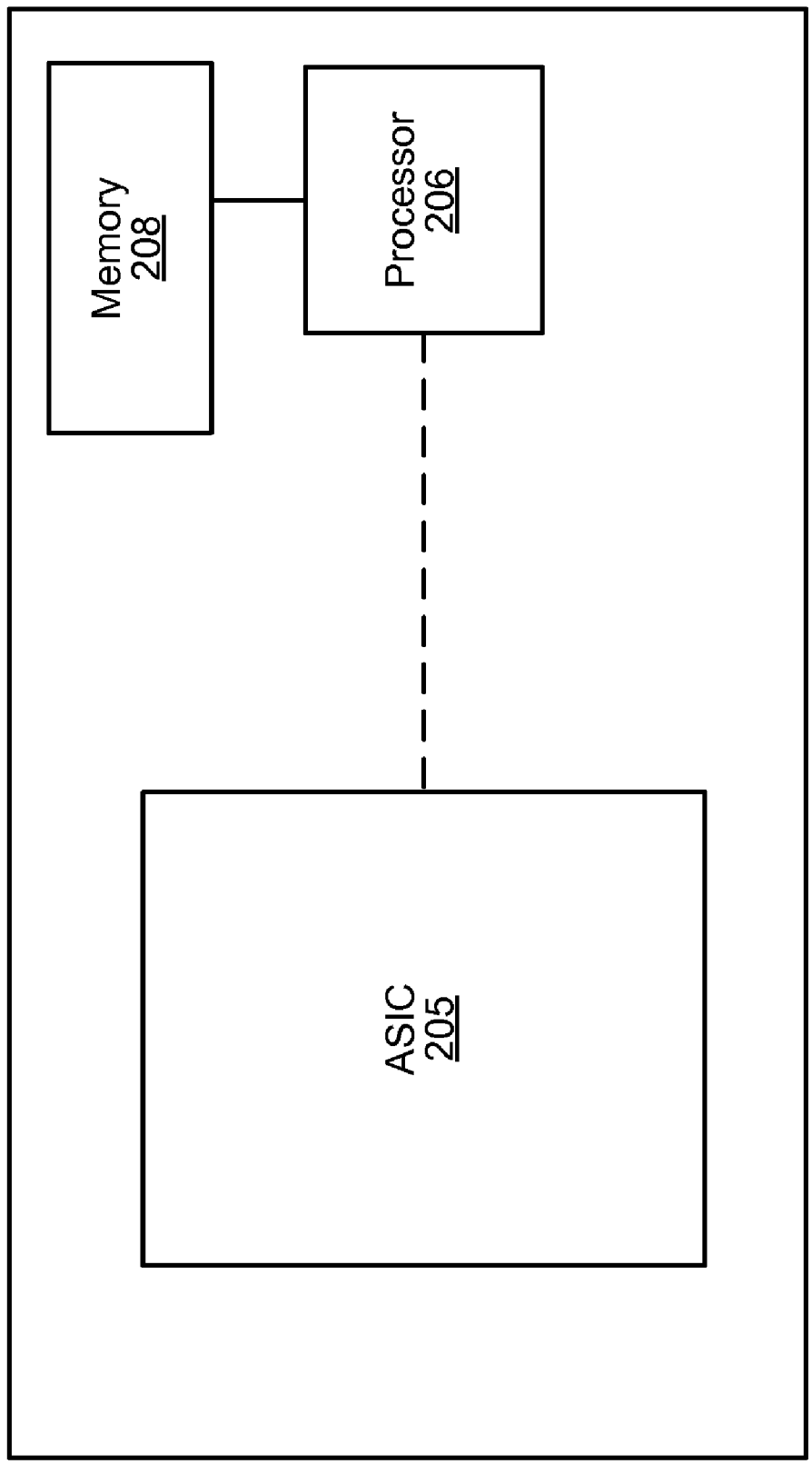
FIG. 2B is a high-level block diagram of an application specific integrated circuit (ASIC) coupled to a controller, according to one embodiment of the invention.

Thus, embodiments of the present invention may be used to configure programmable hardware, or to specify designs for circuits to be implemented FIGS. 2A and 2B: A Device with On-Board Computer FIGS. 2A and 2B are high-level block diagrams illustrating embodiments of a device that includes a circuit according to embodiments of the present invention, as well as an on-board processor and memory.

More specifically, FIG. 2A illustrates one embodiment of a device, e.g., device 90 of FIG. 1A, which, in addition to a programmable hardware element 204 (e.g., FPGA), may optionally include a processor 206 and memory 208. For example, the device may be designed to perform some specified functionality via cooperative (and possibly concurrent) operation of the (configured) programmable hardware element 204 and the processor 206/memory 208, such as, for example, a measurement, control, or automation function, among others. In some embodiments, this processor and memory may comprise a controller, e.g., a controller module in a chassis. For example, as will be explained in more detail below, in some embodiments, the programmable hardware element 204 may be configured to implement some specified functionality, such as a measurement function (or functions) specified by at least one graphical program, and may also be configured to implement various pre-defined functionalities or IP cores, e.g., implemented in or by pre-defined hardware configuration programs, and selected from a plurality of such programs by the user. In various embodiments, software executing on a processor coupled to the programmable hardware element may coordinate or otherwise direct operation of the configured portions of the programmable hardware element, where the processor may be the processor of FIG. 2A (i.e., contained in the device), the processor of a host computer coupled to the programmable hardware element, such as computer system 82, and/or a processor implemented on the programmable hardware element itself, e.g., via configuration or manufacture of the programmable hardware element.

Referring again to FIG. 1B, in some embodiments, a device similar to device 90 may include, instead of a programmable hardware element, an application specific integrated circuit (ASIC) may be implemented in accordance with the netlist, and may also include a processor and memory, where the processor and memory may operate in a coordinated manner with the circuit. FIG. 2B is a high-level block diagram of such a device, where the functionality described above with respect to the programmable hardware element 204 is performed by an ASIC 205. Thus, more generally, the described functionality may be implemented by a circuit, where the circuit may itself be implemented in any of various ways, e.g., as an ASIC, on an FPGA, and so forth, as desired.

Figure 3:
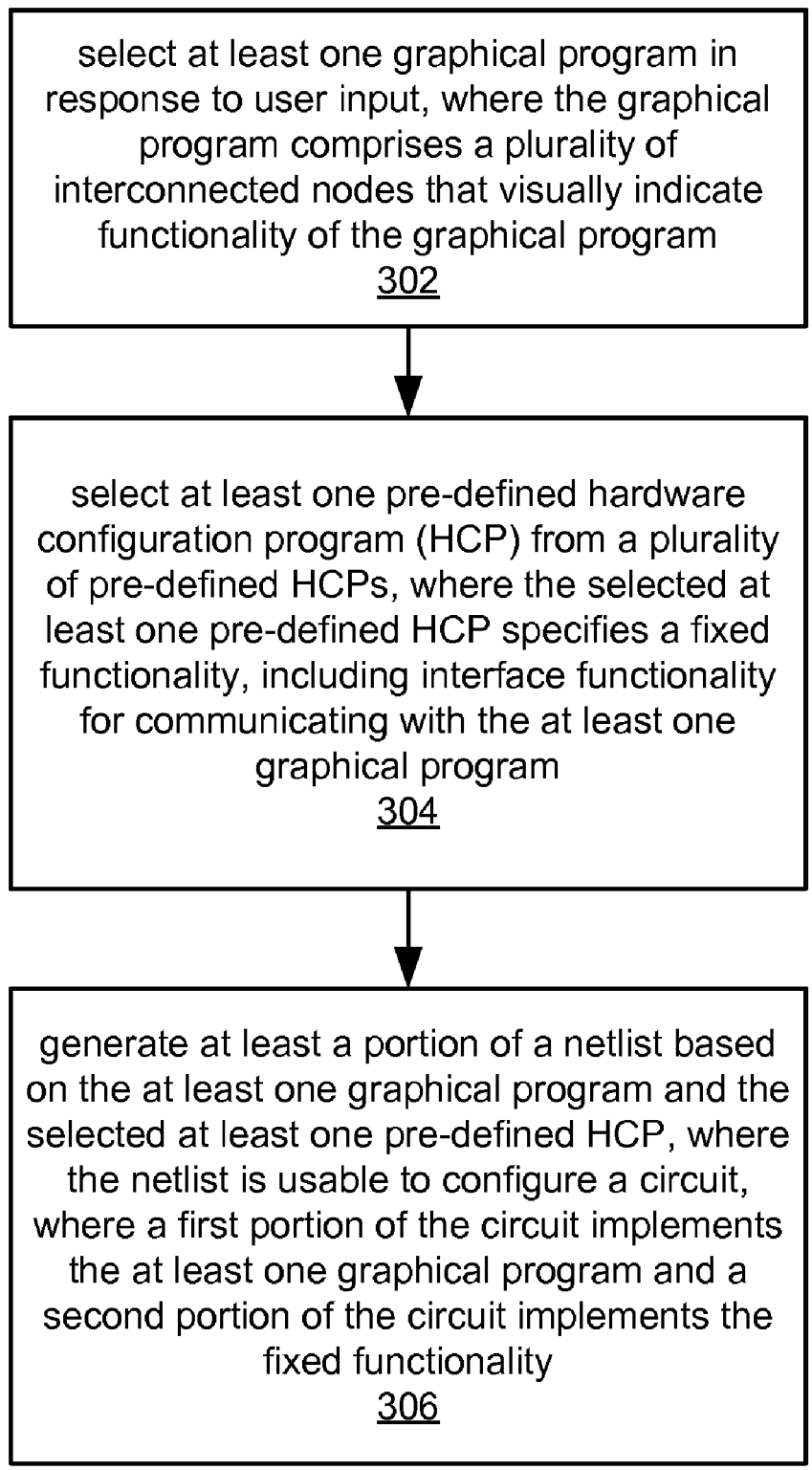
FIG. 3 is a flowchart diagram illustrating one embodiment of a method for designing a circuit.

FIG. 3: Flowchart of Method for Designing a Circuit

FIG. 3 is a high-level flowchart of a method for designing a circuit, according to one embodiment. The method shown in FIG. 3 may be used in conjunction with any of the computer systems or devices shown in the Figures described herein, among other devices. In various embodiments, some of the method elements shown may be performed concurrently, in a different order than shown, or may be omitted. Additional method elements may also be performed as desired. As shown, this method may operate as follows.

In 302, at least one graphical program may be selected in response to user input, where the at least one graphical program includes a plurality of interconnected nodes that visually indicate functionality of the at least one graphical program. The at least one graphical program may implement any functionality desired. Examples of functionality of the at least one graphical program are provided below.

In 304, at least one pre-defined hardware configuration program (HCP) may be selected from a plurality of pre-defined HCPs in response to user input, where the selected at least one pre-defined HCP specifies a fixed functionality, including interface functionality for communicating with the at least one graphical program when implemented on the circuit. For example, the hardware configuration program may be in a hardware description language (HDL), although any other type of hardware configuration program may be used as desired. Examples of standard HDLs include VHDL (VHSIC (Very-High-Speed Integrated Circuit) HDL) and Verilog HDL. In some embodiments, the HCP may be generated based on some other representation of the functionality. For example, the functionality may be designed and implemented in graphical programming language, such as the "G" language of the LabVIEW graphical program development environment, provided by National Instruments Corporation, and converted to the HCP. Note that any other languages may be used as desired, e.g., JAVA™, C, C++, VISUAL BASIC™, and so forth. Such pre-defined HCPs implementing various functionalities may be referred to as "IP cores" (intellectual property cores).

In various embodiments, the plurality of pre-defined HCPs (and possibly a plurality of graphical programs from which the at least one graphical program may be selected) may be stored in the form of a library, or may be stored in a database. In one embodiment, a GUI may be provided for browsing or searching the HCPs. For example, the HCPs may be searchable by functionality, where a user may provide search terms that describe a desired functionality, and may be presented one or more HCPs related to that functionality from which the user may select the at least one HCP for use. In another embodiment, the HCPs may be organized by functionality, and the user may browse or navigate through one or more hierarchies of HCPs based on descriptive names or functional descriptions of the programs, e.g., via a hierarchical menu system or directory structure. In some embodiments, each HCP may be represented by an icon, e.g., in a palette, or a system of hierarchical palettes, from which the user may select the desired HCP, e.g., by dragging and dropping the icon onto a diagram representing the circuit, as will be described in more detail below.

Thus, the user may select at least one graphical program and at least one HCP (e.g., IP core) specifying or implementing desired functionality for a circuit, such as a programmable hardware element or an ASIC.

In 306, at least a portion of a netlist may be generated based on the at least one graphical program and the at least one selected pre-defined HCP. For example, the at least one graphical program and the at least one selected pre-defined HCP may be compiled to generate the netlist, e.g., using a logic compiler or other tools. The netlist may be usable to configure a circuit, where a first portion of the circuit implements the functionality of the graphical program and a second portion of the circuit implements the fixed functionality (of the at least one HCP).

In one embodiment, the circuit may include or be a programmable hardware element that includes a programmable gate array, e.g., an FPGA. The programmable hardware element may be configured based on the netlist to produce a configured programmable hardware element, where a first portion of the configured programmable hardware element implements the functionality of the at least one graphical program and a second portion of the configured programmable hardware element implements the fixed functionality. During operation of the configured programmable hardware element the first portion of the configured programmable hardware element may perform the functionality of the graphical program, and the second portion of the configured programmable hardware element may perform the fixed functionality.

In one embodiment, the configured programmable hardware element may include a processor (e.g., configured or manufactured on the element). During operation of the configured programmable hardware element the configured programmable hardware element may be operable to receive commands from the processor and perform operations based on the commands. Similarly, as indicated above, the programmable hardware element may be coupled to a processor and memory, and may operate in conjunction with the processor, e.g., performing operations in response to commands from the processor.

Alternatively (or in addition), in some embodiments, e.g., where the circuit is or includes an ASIC, the netlist may be send to a circuit manufacturer to manufacture the ASIC, where the ASIC implements the functionality of the at least one graphical program and the at least one HCP.

Note that in some embodiments, the user may add or specify additional functionality to be encoded in the netlist, e.g., prior to configuring the programmable hardware element or sending the netlist to the manufacturer. In other words, in addition to selecting the at least one graphical program and the at least one HCP, both of which may have pre-defined functionality, the user may further specify "custom" functionality to include in the circuit, such as additional components or circuit elements, and/or additional operations. Similarly, in some embodiments, the user may edit the at least one graphical program prior to generation of the netlist, e.g., to customize the program to suit the particular needs of the user. Note also that in some embodiments, the user may actually develop the at least one graphical program, e.g., in an editor, and then may select the program for use, as described above.

As noted above, the at least one graphical program may implement any functionality desired. For example, in one embodiment, the at least one graphical program may implement interface functionality for communicating with a host interface executing on a processor coupled to the circuit, where during operation of the circuit, the first portion of the circuit may be operable to communicate with the host interface. Note that as used herein, a host interface refers to a set of functions that allows the circuit and a host processor to talk to each other. For example, in an FPGA embodiment, the host interface may allow an application executing on the host processor to read and write registers that are also accessible from the FPGA fabric, i.e., from the circuit configured on the FPGA, this being but one example of such interface functionality.

In another embodiment, the at least one graphical program may implement interface functionality for communicating with an I/O element coupled to the first portion of the circuit, and where during operation of the circuit, the first portion of the circuit is operable to communicate with the I/O element. For example, in one exemplary embodiment, the at least one graphical program may contain graphical elements, e.g., nodes, whose functionality is to read data from an analog to digital converter (ADC), write data to a digital to analog converter (DAC), and/or read and write data to/from digital lines. Of course, any other I/O interface functionality may be used as desired.

In other embodiments, the at least one graphical program may implement data or signal processing, analysis, generation, or acquisition functionality, among others. Thus, the at least one graphical program may implement any functionality desired.

Similarly, in various embodiments, the HCP may implement any functionality desired, e.g., the HCP may implement various interfaces, e.g., for the graphical program and/or for systems or components coupled to the circuit. For example, in one embodiment, the selected at least one pre-defined HCP may be configured to implement an interface for a software application executing on a processor coupled to the circuit, where during operation of the circuit, the interface may provide an application interface for the software application. For example, in one exemplary embodiment, an HCP may provide or implement a set of registers for interfacing with a data acquisition (DAQ) device driver, thus allowing the software application to talk to the HCP (portion of the circuit) through an existing API of the DAQ driver. Of course, any other interface functionality may be implemented by the HCP as desired.

In another embodiment, the selected at least one pre-defined HCP may be configured to implement an input/output (I/O) interface for an I/O element coupled to the second portion of the circuit, where during operation of the circuit, the I/O interface may provide an interface for the I/O element. For example, in one exemplary embodiment, the HCP may include or specify logic implementing a counter by reading and writing to digital I/O lines, this being but one example of such an I/O interface.

In a further embodiment, the selected at least one pre-defined HCP may be configured to implement a data acquisition function, where during operation of the circuit, the second portion of the circuit may be operable to perform the data acquisition function to acquire data from a physical system. For example, in one exemplary embodiment, the HCP may include or specify logic to sample an ADC at a specified rate in order to acquire a waveform.

In yet another embodiment, the selected at least one pre-defined HCP may be configured to implement a data analysis function, where during operation of the circuit, the second portion of the circuit is operable to perform the data analysis function. In one embodiment, the at least one graphical program may specify or implement a data acquisition function, where during operation of the circuit, the first portion of the circuit is operable to perform the data acquisition function to acquire data from a physical system. Note that as used herein, the term "data analysis" may include data processing, e.g., data filtering, transformation, or otherwise manipulating data or signals.

In some embodiments, the first and second portions of the circuit may operate conjunctively or cooperatively to perform some desired task or operations. For example, in one embodiment, the at least one graphical program may specify a data analysis function, and the selected at least one pre-defined HCP may be configured to implement a data acquisition function, where during operation of the circuit, the first portion of the circuit is operable to analyze data acquired by the second portion of the circuit. Conversely, the at least one graphical program may specify a data acquisition function, and the selected at least one pre-defined HCP may be configured to implement a data analysis function, where during operation of the circuit, the second portion of the circuit may be operable to analyze data acquired by the first portion of the circuit.

Note that these functionalities and interfaces are meant to be exemplary, and that any other types of interface and functionalities may be implemented as desired.

For example, in one embodiment, the fixed functionality (of the HCP) may include timing and data transfer functionality for the at least one graphical program functionality implemented on the first portion of the circuit, for a software application executing on a processor coupled to the circuit, and/or for an I/O element coupled to the second portion of the circuit. For example, in one exemplary embodiment, the software application may specify channels from which to acquire data, as well as the rate at which to acquire the data. Channels coupled to the HCP portion of the circuit may then be sampled according to the predefined HCP functionality and sent to the software application by the predefined HCP data transfer functionality. The HCP portion of the circuit may also send its timing information to the graphical program portion of the circuit, and this timing information may be used to sample the channels coupled to the graphical program portion of the circuit at the specified rate. The data from the graphical program portion of the circuit may then be sent to the software application, also by the predefined HCP data transfer functionality. Thus, the HCP functionality may implement and manage timing and data transfer operations for portions of the circuit and/or for external entities coupled to the circuit.

In one embodiment, the interface functionality may be configurable, e.g., after the at least one HCP has been selected. For example, user input may be received (via a GUI) configuring one or more aspects of the interface functionality for communicating with the graphical program functionality implemented on the first portion of the circuit. Generating the at least a portion of the netlist may then be performed in accordance with the configuration of the one or more aspects. For example, in one exemplary embodiment, the selected HCP may be configured to send a specific type and quantity of data from the graphical program. For example, if the graphical program is configured to acquire two channels of data, where each channel is 16 bits wide, and to utilize the HCP's data transfer functionality to transfer data to the software application, the HCP interface may be configured to accept two separate 16-bit data points. Of course, this is but one exemplary interface functionality, and any others may be used as desired.

As noted above, in preferred embodiments, the above method may be performed via a graphical user interface. For example, the method may include displaying a graphical user interface on a display, where selecting at least one the graphical program and selecting the at least one pre-defined HCP includes receiving user input adding the at least one graphical program and the selected at least one pre-defined HCP to a portion of the graphical user interface (GUI).

The user may make these selections via any of a number of GUI techniques. For example, in one embodiment, a tree structure may be displayed on a display, e.g., a computer monitor, and selecting the at least one graphical program and selecting the at least one pre-defined HCP may include receiving user input adding the at least one graphical program and the at least one pre-defined HCP to the tree structure. In other words, the tree structure may operate as a GUI for configuring the circuit design. In one embodiment, receiving user input adding the at least one graphical program and the selected at least one pre-defined HCP to the tree structure may include one or more of: receiving user input dragging and dropping respective icons representing the at least one graphical program and the selected at least one pre-defined HCP onto the tree structure, or receiving user input to the tree structure invoking a menu, and receiving user input to the menu selecting the at least one graphical program and the at least one pre-defined HCP from the menu.

As another example, the method may include displaying a GUI on a display, where the GUI includes an image of the circuit. For example, in some embodiments, the image of the circuit may be a block diagram or a schematic diagram representing the circuit. Selecting the at least one graphical program and selecting the at least one pre-defined HCP may include receiving user input adding icons representing the at least one graphical program and the selected at least one pre-defined HCP to the image of the circuit, as mentioned above. For example, the icons may be selected from a palette or a set of palettes. Of course, any other selection means may be used as desired.

Figure 4A:
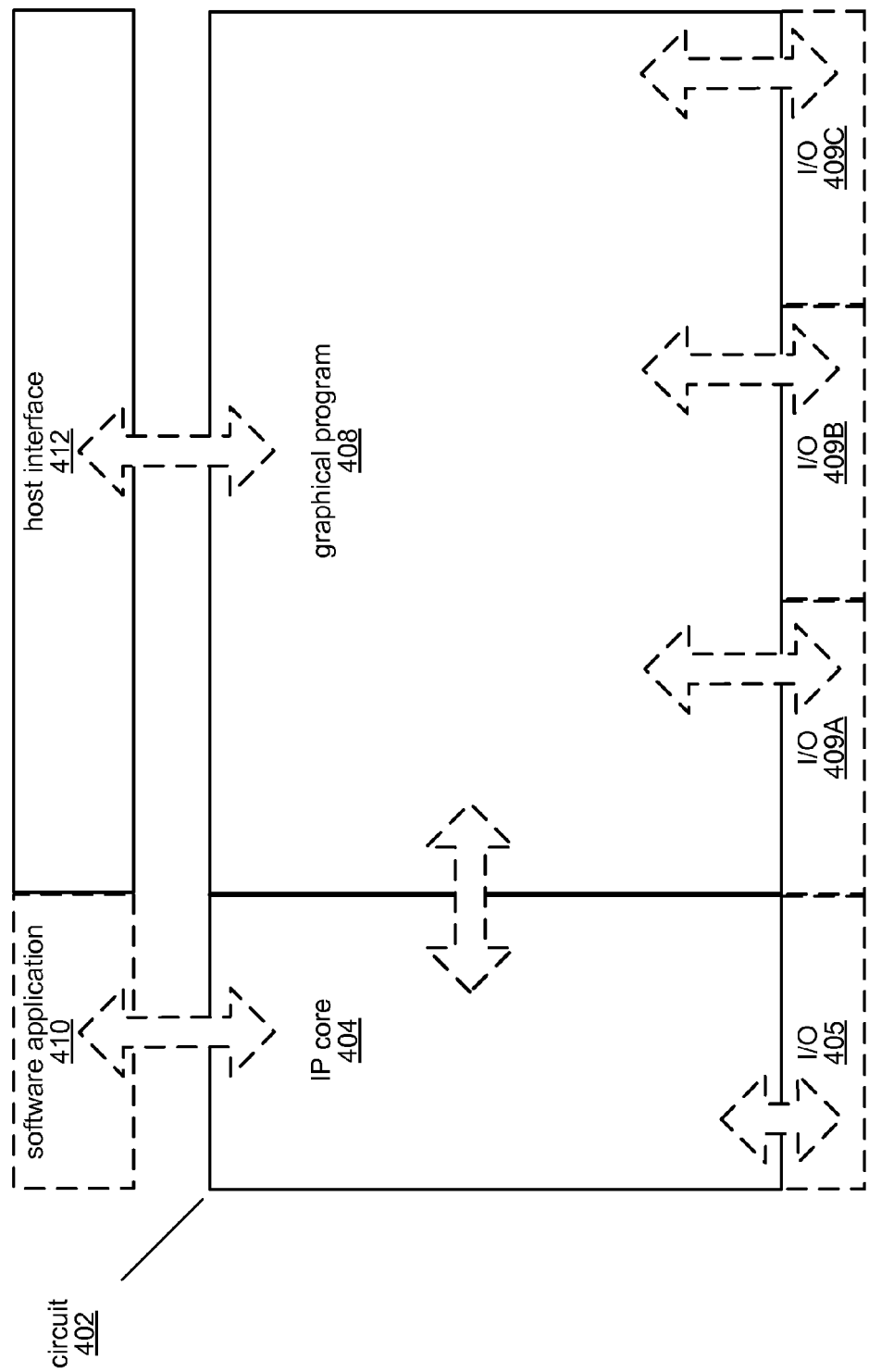
FIG. 4A is a high-level block diagram of a circuit configured with a graphical program portion and a pre-defined IP core, according to one embodiment.
Figure 4B:
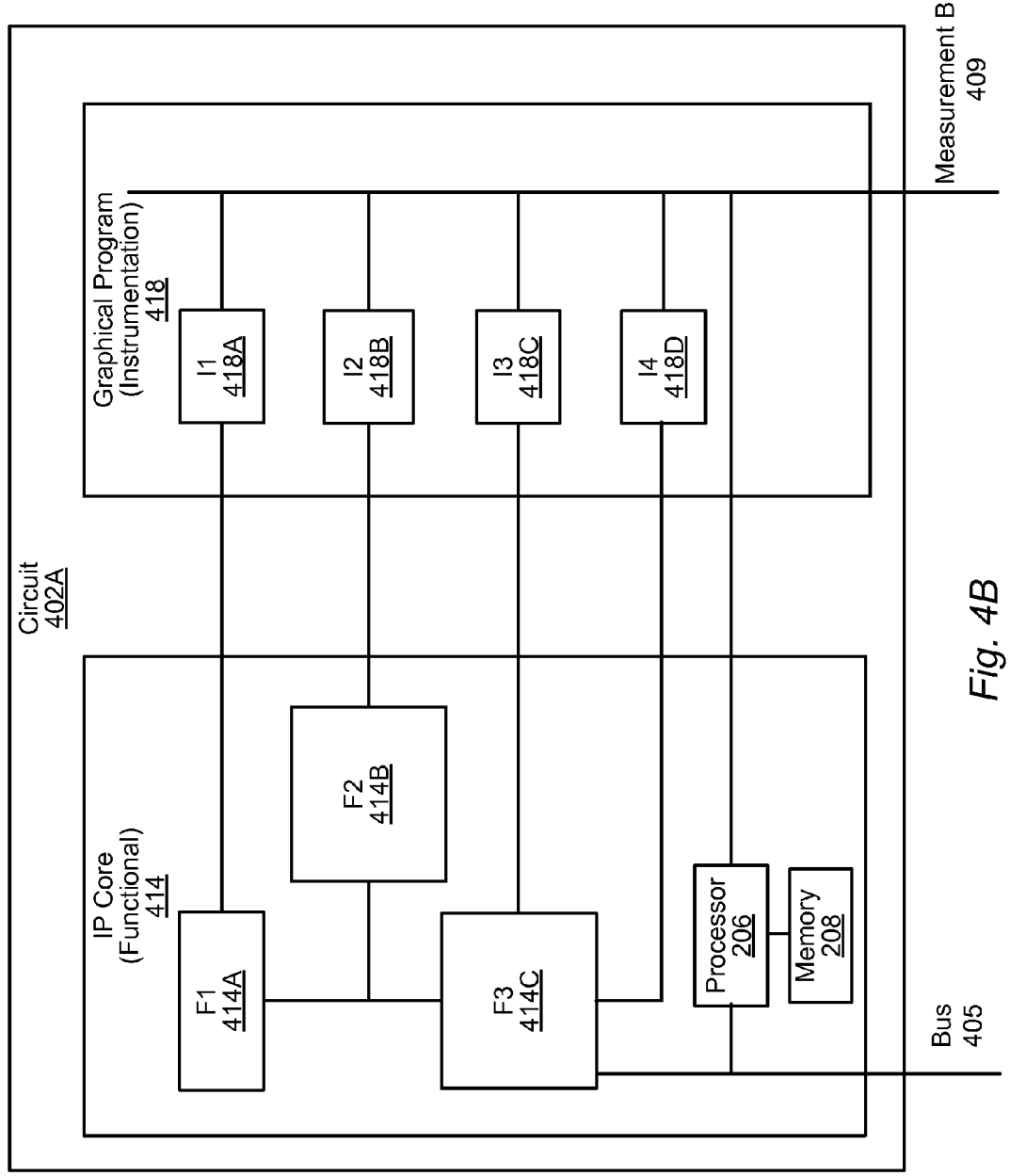
FIG. 4B is an exemplary high-level circuit layout directed to an on-circuit instrumentation application, according to one embodiment.

FIGS. 4A and 4B—Exemplary Circuit Layouts

FIGS. 4A and 4B illustrate exemplary high-level circuit layouts, according to one embodiment. More specifically, FIG. 4A is a high-level block diagram illustrating various possible relationships among portions of a circuit design for a circuit 402 (and therefore, relationships of the corresponding circuit 402). It should be noted that the embodiment of FIG. 4A is exemplary only, and is not intended to limit the circuit design or layout to any particular form, function, or appearance, but rather is intended to illustrate various ways in which the circuit may function as an interface for other systems or components, and/or for portions of the circuit. Similarly, the layout of FIG. 4B, directed to an on-circuit instrumentation application, is exemplary only, and is not intended to limit the circuit design to any particular components, architecture, or functionality. Note that the circuit layouts of FIGS. 4A and 4B may apply to a programmable hardware element or to an ASIC (or to any other type of circuit).

As FIG. 4A shows, in some embodiments, the circuit 402 (or circuit design or layout) may include a first portion that includes or implements functionality of the at least one graphical program 408, and a second portion that includes an IP core, i.e., the functionality of the at least one HCP. As indicated by the various dashed two-way arrows in the diagram, each portion may be configured to communicate with external elements or systems, as well as with each other. For example, as FIG. 4A indicates, in various embodiments, the IP core portion 404 may be configured to communicate with, and thus operate as an interface for, the graphical program portion 408, a software application 410, and/or at least one I/O element 405. Similarly, in various embodiments, the graphical program portion 408 may be configured to communicate with, and thus operate as an interface for, the IP core portion of the circuit 404, various I/O elements 409 (e.g., I/O elements 409A, 409B, and 409C), and/or host interface 412.

Thus, for example, in one exemplary application, the IP core 404 may provide timing and data transfer functionality with respect to I/O 405 and a protocol implemented by software application 410, e.g., a controller engine, where the IP core portion 404 may acquire input via I/O element 405, pass the acquired data to the graphical program portion 408 for processing/analysis, and send results to the software application 410. As another example, in one embodiment, the graphical portion may also acquire data via I/O element 409(A) in response to timing information from the IP Core. Filtering or other operations may be applied to the data before sending the data to the software application 410 by utilizing the data transfer functionality in the IP core 404.

Of course, these examples are exemplary only, and any particular embodiment may utilize all or any subset of the indicated communication relationships or links illustrated by the two-way arrows of FIG. 4A.

FIG. 4B illustrates an exemplary embodiment of a circuit or a circuit layout 402A configured with an instrumentation portion 418, and a functional portion 414, where the instrumentation portion of the circuit (i.e., the first portion, corresponding to the at least one graphical program) implements various instruments and the functional portion of the circuit (i.e., the second portion, corresponding to the at least one HCP) implements various functions (in the form of functional components) that may generate or process data or signals. Examples of functional components that may be implemented in the functional portion 414 of the circuit may include data transfer, filters, counters, triggers, timing signals, and processors, among others. In other words, any type of functional component may be implemented in the functional portion 414 as desired.

More specifically, as FIG. 4B shows, in this exemplary embodiment, the functional components 414 may include functions (i.e., components) F1 414A, F2 414B, and F3 414C. Similarly, the instrumentation portion 418 is shown with a plurality of instruments I1 418A, I2 418B, I3 418C, and I4 418D. Note that, as used herein, the one or more instruments configured on the programmable hardware element may be referred to collectively as instrumentation or instruments 418. As also shown, the functional components 414 may be coupled to a bus 405 for communicating with each other and with external elements or systems. Similarly, as mentioned above, each of the instruments 418 may be coupled to a measurement bus 409 for communicating with each other and with external elements or systems, such as an external computer system.

Note that FIG. 4B illustrates an embodiment in which the functional portion 414 of the circuit includes a processor 206 and memory 208. As discussed above, in various embodiments, the processor/memory may be configured on the circuit, may be manufactured in situ, or simply coupled to the circuit. As may be seen, in this embodiment, the processor 206 is coupled to both bus 405 and measurement bus 409. Thus, even though the processor/memory may be included on the circuit primarily for functional use, i.e., as part of the functional portion 414, the processor and memory may also be used by the instrumentation portion 418 via the measurement bus 409.

Figure 5:
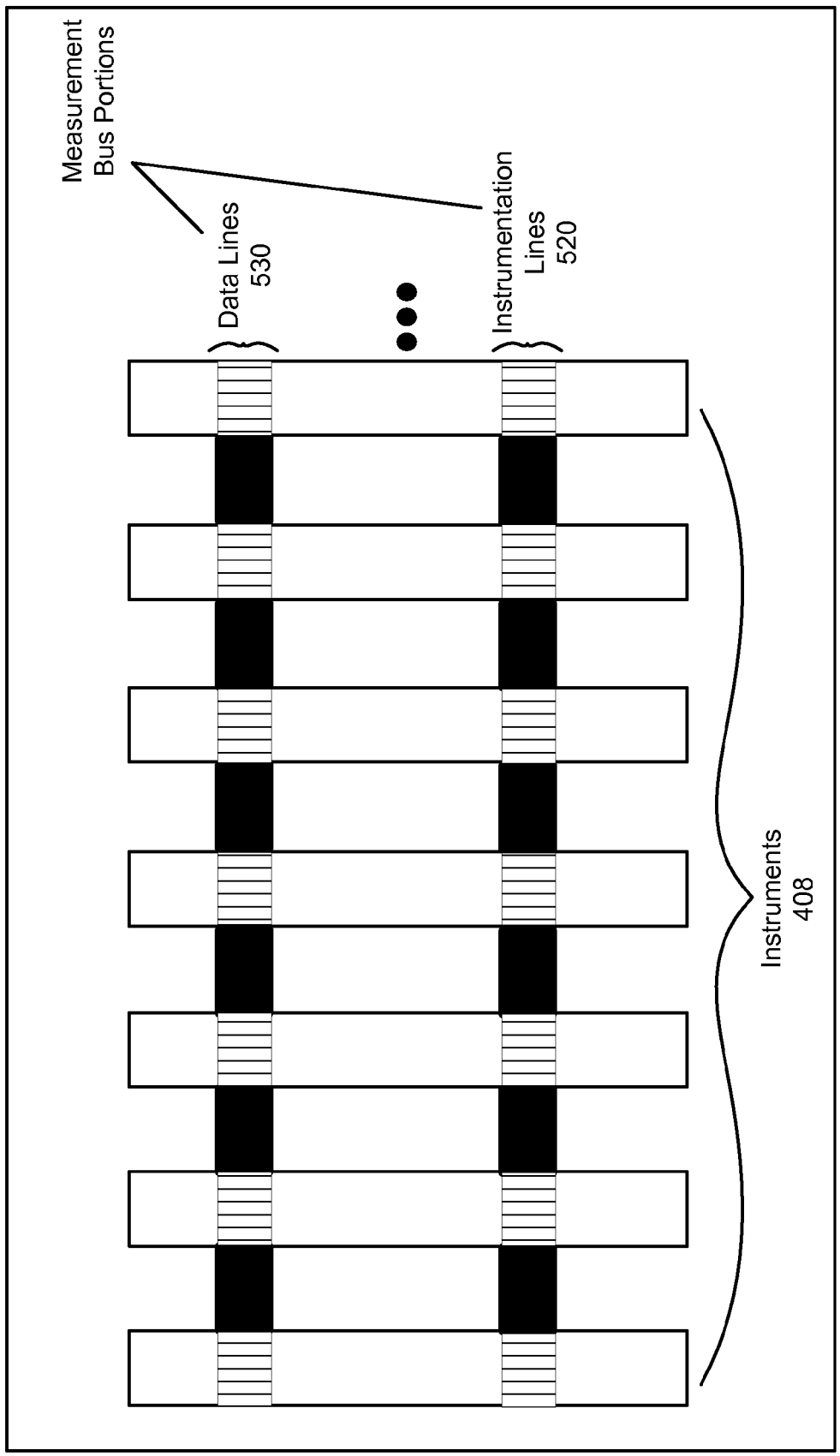
FIG. 5 illustrates an exemplary measurement bus, according to one embodiment.
Figure 6:
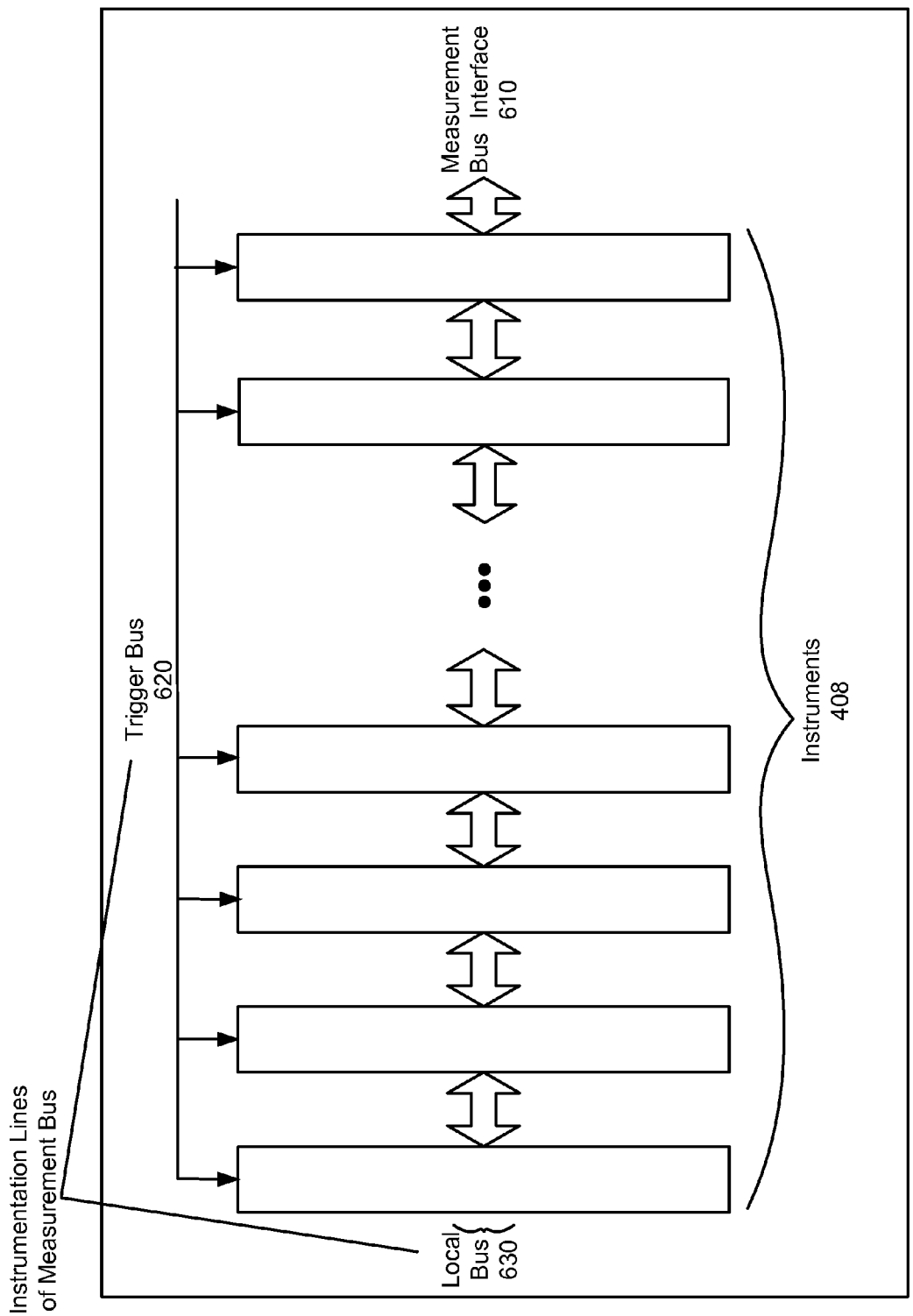
FIG. 6 illustrates instrumentation lines of a measurement bus, according to one embodiment.
Figure 7:
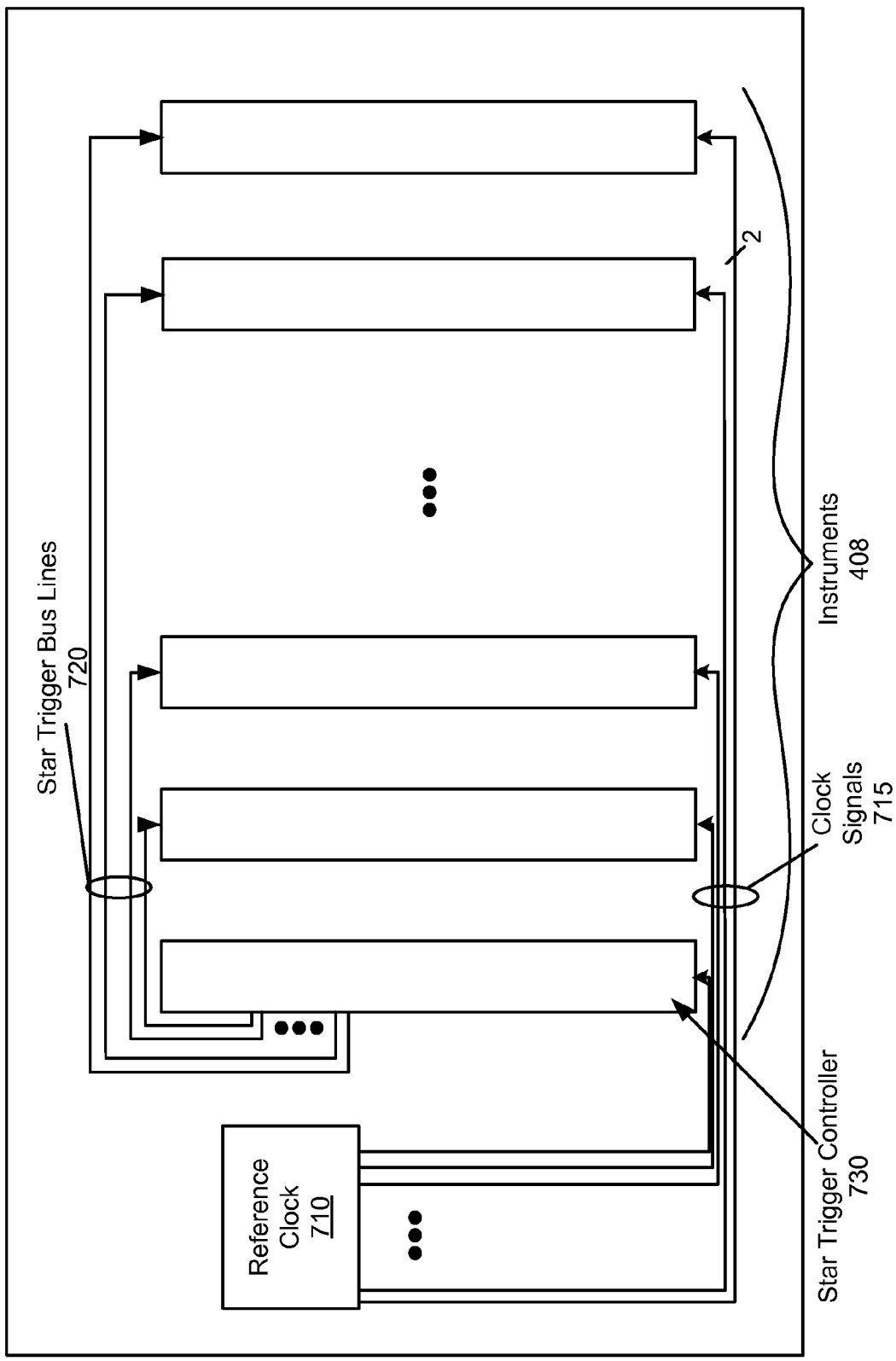
FIG. 7 illustrates clock and trigger lines of a measurement bus, according to one embodiment.

In some embodiments, the measurement bus may include a plurality of lines that may be used for any of various communication or transmission purposes. FIGS. 5, 6, and 7 illustrate embodiments of respective portions of an exemplary measurement bus for facilitating communications among on-circuit instruments, such as measurement bus 409 of FIG. 4B. As FIG. 5 shows, as with the example of FIG. 4B, in this embodiment, the circuit is configured with a plurality of instruments 418. As noted above, and as also illustrated in FIG. 5, the measurement bus preferably includes data lines 530 for transmitting data to and from on-circuit instruments 418, and instrumentation lines 520 for timing, triggering, control, etc., of the instruments 418 (and in some embodiments, one or more functional components 414, and/or a processor/memory).

For example, in one embodiment, the instrumentation lines 520 may be used to transmit commands from a processor (on-circuit, or external) to an instrument to acquire data from a functional portion of the programmable hardware element, and the data lines 530 may be used to transmit the acquired data to the processor or to another instrument on the bus. Of course, in various embodiments, the instrumentation lines 520 may be used to transmit any type of command or control data or signals to and from the instruments 418 as desired. Each of the instruments may couple to the instrumentation lines 520, and so the instrumentation lines 520 may provide an extra set of communication lines for instrumentation signaling functions, such as a local bus, a trigger bus, one or more reference clocks, and a star trigger bus, described below with reference to FIGS. 6 and 7. In some embodiments, the plurality of instrumentation lines may further include a high voltage analog bus and/or a low voltage analog bus. The data lines 530 may be used to communicate any type of data to and from the instruments 418 as desired.

In some embodiments, the plurality of instrumentation lines in the measurement bus includes one or more timing signal paths and one or more trigger signal paths, as noted above. FIG. 6 illustrates an embodiment where the programmable hardware element is configured with a plurality of instruments 418, where, as shown, respective portions of the instrumentation lines 520 of the measurement bus implement a local bus 630 for inter-instrument communication, and a trigger bus 620 for sending trigger signals to (and possibly from) each of the instruments 418, e.g., for inter-instrument synchronization and communication. In other words, the local bus 630 may provide a communication path for adjacent instrument communication. In one embodiment, the local bus 630 may be operable to facilitate communication of analog signals and digital signals, such as side-band digital communication signals between adjacent instruments. It should be noted that this side-band digital communication does not affect the data bandwidth, since the data lines and instrumentation lines are distinct. In one embodiment, at least a subset of the instruments may define the use of the local bus 630, i.e., the functions of the local bus 630 may be user-defined. In one embodiment, the local bus 630 may include a plurality of parallel communication lines. Note that in the embodiment of FIG. 6, the local bus 630 may include or utilize a measurement bus interface 610, facilitating communication of the instruments with other lines of the measurement bus, and/or external components or elements coupled to the measurement bus, e.g., a host interface or software application executing on a computer system coupled to the circuit.

In one embodiment, the trigger bus 620 may include a plurality of trigger lines which couple corresponding instruments 418 to the trigger bus 620. The trigger bus 620 may thus be operable to communicate trigger signals between the instruments. For example, trigger signals may be transmitted over the trigger bus 620 to synchronize the operation of several different instruments. In one embodiment, trigger signals may be passed from one instrument to another instrument over the trigger bus 620, allowing precisely timed responses to asynchronous events being monitored or controlled. In one embodiment, one or more of the trigger bus signals 620 may be designated for open-collector signaling. In other words, the trigger bus signal may be initiated by one or more trigger sources without the possibility of contention. In one embodiment, the trigger bus 620 lines may also be used to transmit alternate clock signals to selected instruments, i.e., signals from an auxiliary clock that differs from a primary system reference clock, described below with reference to FIG. 7.

FIG. 7 is a block diagram of an embodiment where at least a subset of the instrumentation lines 520 have been defined to include reference clock signal lines and a star trigger bus. As FIG. 7 shows, each of the plurality of instruments 418 may be coupled to one or more reference clocks 710 by one or more reference clock signal lines 715. In this example, only one reference clock 710 is shown, although in other embodiments, two or more reference clocks may be used. The reference clock lines may be operable to transmit reference clock signals generated by the reference clock 710 to each of the instruments 418, thereby providing synchronization signals to the corresponding instruments. In various embodiments, the reference clock 710 may be included as a separate instrumentation component, may be included in an instrument, such as a system controller, implemented in the instrumentation portion 418, or may be included on an external system coupled to the circuit, where the reference clock signals are transmitted to the circuit via a transmission line, e.g., on the measurement bus. In an embodiment where multiple reference clocks are used, various of the clocks may be included as separate components, in one or more instruments, and/or on an external system coupled to the circuit, e.g., a host computer.

As also shown in FIG. 7, in one embodiment, the plurality of instruments 418 may include a star trigger controller 730. As shown, the measurement bus may include a star trigger bus 720 that includes a plurality of dedicated star trigger bus lines 720 that couple the star trigger controller 730 to each of the other instruments. The star trigger controller 730 may be operable to provide precision trigger signals over the star trigger bus lines 720 to synchronize operations of the instruments 418. In one embodiment, each of the dedicated trigger lines may be of equal length to provide matched propagation times of the trigger signals. In another embodiment, the star trigger bus 720 may include one or more differential trigger lines, in which the trigger signal is determined from the difference in signals on two star trigger lines.

Note that the embodiments of FIGS. 5, 6, and 7, are meant to be exemplary only, and that the features described may be included in various different combinations or in different implementations. For example, in some embodiments, one or more of the transmission or communication lines or buses may be implemented in the functional portion of the circuit (i.e., according to the at least one HCP). Similarly, various functionalities described above with respect to the functional portion may instead be implemented in the instrumentation portion of the circuit.

Note that the functionality and architecture described above with respect to FIGS. 4A-7 are meant to be exemplary only, and are not intended to limit the form, function, or appearance of the circuit or circuit design to any particular form, function, or appearance.

Figure 8:
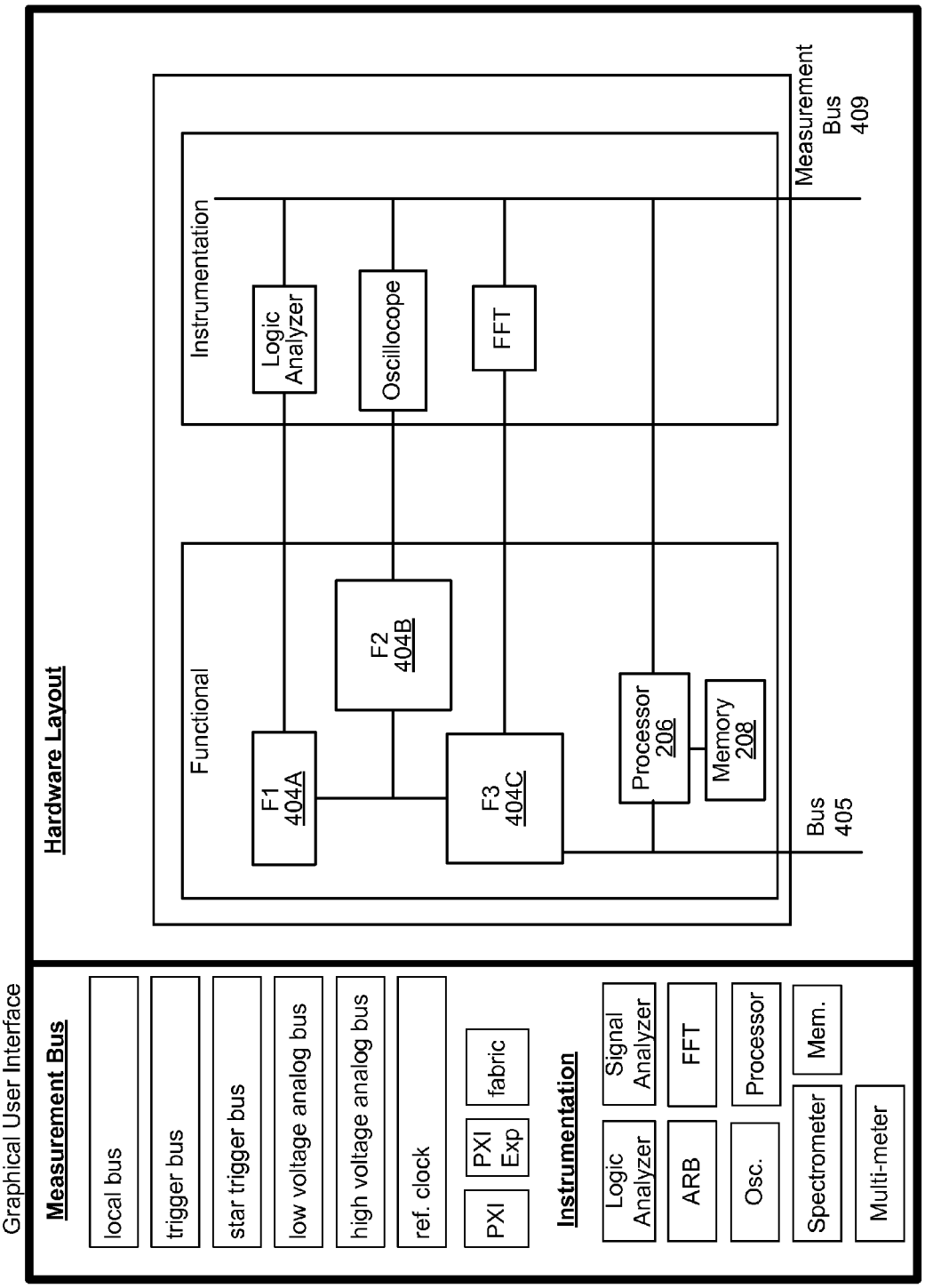
FIG. 8 illustrates an exemplary graphical user interface for configuring instrumentation on a programmable hardware element, according to one embodiment.

FIG. 8—Graphical User Interface

As noted above, in some embodiments, the above-described methods may be implemented using a graphical user interface (GUI). FIG. 8 illustrates one exemplary embodiment of such a GUI directed to the exemplary instrumentation application of FIG. 4B, although it should be noted that the GUI described herein is not intended to limit the GUIs contemplated for use in the systems and methods described herein. For example, in other embodiments, the selectable components displayed in the left portion (e.g., palettes) of the GUI may differ from those shown. For example, in some embodiments, palettes presenting selectable components, e.g., graphical programs, HCPs, etc., may themselves be dynamically chosen by a user, and subsequently used to select the particular graphical program(s) and HCP(s). For example, as noted above, in some embodiments, the palettes may be hierarchical, where the user may browse the hierarchy to locate collections of graphical programs or HCPs according to the desired functionality of the circuit, and select them from the appropriate palette. Thus, for a signal analysis application the user may invoke display of a palette of icons representing selectable graphical programs that may provide supervisory control of a suite of analysis functions (including signal processing functions), which themselves may be selected from a palette of analysis-related HCPs. Of course, other browsing and selection means may be used as desired, e.g., menus, directories, and so forth. Similarly, the respective graphical programs and the HCPs may include or implement any functionalities desired.

As FIG. 8 shows, in one exemplary embodiment, the GUI may include a configurable hardware layout display portion (e.g., window), in which the configuration of the circuit (e.g., a programmable hardware element or ASIC) may be displayed, as well as a portion for selecting components, e.g., instruments and/or buses for implementation on the circuit. In this embodiment, various selection options are displayed for specifying a measurement bus, including, for example, options for local bus, trigger bus, star trigger bus, low voltage analog bus, high voltage analog bus, and reference clock. As also shown, options are presented for selecting a bus protocol, e.g., PXI, PXI-Express, and fabric, among others. It should be noted that these measurement bus specification options are meant to be exemplary only, and are not intended to limit the types of buses or bus functionality to any particular set of buses or functions.

Below the measurement bus specification are presented various user-selectable instrumentation options whereby the user may specify instruments for implementation on the circuit, including, for example, logic analyzers, signal analyzers, arbitrary waveform generators (ARB), Fast-Fourier Transforms, oscilloscopes, spectrometers, multi-meters, among others, and possibly processors and memory. These buses and/or instruments may be selected or specified by any of various means.

For example, as mentioned above, in one embodiment, the options may be displayed as selectable icons in palettes, where the user may drag and drop selected components onto the hardware layout to specify implementation of the component in the circuit. As noted above, in some embodiments, the user may add additional elements or otherwise modify the circuit design prior to generation of the netlist. For example, following the instrumentation application example of FIG. 4B and FIG. 8, in one embodiment, the user may select a bus or line type, then draw a bus or bus portion directly on the hardware layout to specify that bus or line. Alternately, the user may draw or otherwise specify the various buses or lines, then specify the types of each by selecting a line or bus (e.g., by double clicking, etc.), then selecting the type for that line or bus, e.g., by selecting one of the selectable options, or via a pop-up dialog or menu, among other means. Thus, for example, the user may draw a bus between an instrument and a functional component, and then specify the type of the bus. Thus, to specify buses (and component interconnectivity), the user may draw a measurement bus, then draw lines connecting each instrument to the measurement bus, and so forth.

As discussed above, in some embodiments, the user may specify components for inclusion in the design, e.g., the instruments of FIG. 4B, by dragging and dropping icons representing graphical programs, HCPs, or additional components, from a palette, e.g., an instrumentation palette, onto the hardware layout display. The palette(s) (or menus, etc.) may be displayed in a specified portion of the GUI, as with the embodiment of FIG. 8, or may be invoked as needed, e.g., by right-clicking on the hardware layout, clicking a pull-down menu from a function bar, etc.

It should also be noted that the icons or buttons shown are exemplary, and that any types of icons, symbols, or buttons, or any other option/selection means may be used as desired. For example, in one embodiment, different lines may be displayed in a measurement bus legend, where each line has a distinct appearance for selection, and possibly when displayed in the layout diagram. Similarly, in preferred embodiments, each instrument icon may include a representative image or symbol (or label) indicating the type of instrument. As another example, in some embodiments, menus may be invoked presenting the various selectable options to the user. In another embodiment, a wizard or a series of dialogs may be presented to the user, whereby the user may specify the measurement bus and/or instrumentation.

In one embodiment, after the buses and instruments have been specified (and displayed in the hardware layout display), the user may select any of the specified buses or instruments and modify or configure the component, e.g., changing the type, setting parameters, and so forth. Similarly, the user may modify the hardware layout, e.g., by rearranging the components, changing connections, adding or removing additional instruments or buses, and so forth, as desired.

As may be seen, in this particular example, a circuit similar to the exemplary circuit of FIG. 4B is shown being specified for configuration, where the instrumentation portion includes a measurement bus 409, coupled to a logic analyzer, an oscilloscope, and an FFT processor. Each of these instruments has further been coupled to respective functional components F1 414A, F2 414B, and F3 414C. As also shown, the measurement bus has been coupled to processor 206 and memory 208.

In various embodiments, the GUI described herein may be a stand-alone tool, or invoked within a development environment, e.g., as a plug-in, or linked-in tool. Alternately, the GUI may be integrated into the development environment. For example, embodiments of the present invention may operate in conjunction with, or as part of, various EDA (electronic design automation) tools.

In preferred embodiments, the GUI may facilitate specification of the functional portion(s) of the circuit, as well. For example, the user may invoke one or more palettes or menus (or other selection means) that present available HCPs for selection, e.g., by selecting an "import" option, and, for example, browsing for HCPs implementing functional components, e.g., F1-F3 of FIG. 4B, although any other means of including functional components into the circuit design (diagram) may be used as desired.

In one embodiment, the GUI may include controls or other means for invoking generation of the netlist from the selected graphical program(s), the selected HCP(s), and possibly other components or functionality desired for the circuit. Similarly, in some embodiments, the GUI may provide controls or other means for deploying the netlist to a programmable hardware element, and/or for sending the netlist to a circuit manufacturer to manufacture the circuit.

Thus, the GUI may provide graphical means for selecting graphical programs and HCPs for inclusion in a circuit design.

Thus, various embodiments of the above systems and methods may be used to design and possibly implement Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A computer-implemented method for designing a circuit, the method comprising:

selecting at least one graphical program in response to user input, wherein the at least one graphical program comprises a plurality of interconnected nodes that visually indicate functionality of the graphical program;

selecting at least one pre-defined hardware configuration program (HCP) from a plurality of pre-defined HCPs in response to user input, wherein the selected at least one pre-defined HCP specifies a fixed functionality, including interface functionality for communicating with the at least one graphical program when implemented on the circuit;

generating at least a portion of a netlist based on the at least one graphical program and the at least one selected pre-defined HCP;

wherein the netlist is usable to configure a circuit, wherein a first portion of the circuit implements the functionality of the graphical program and a second portion of the circuit implements the fixed functionality, and wherein the circuit comprises a programmable hardware element that includes a programmable gate array;

configuring the programmable hardware element based on the netlist to produce a configured programmable hardware element, wherein a first portion of the configured programmable hardware element implements the functionality of the at least one graphical program and a second portion of the configured programmable hardware element implements the fixed functionality;

wherein during operation of the configured programmable hardware element the first portion of the configured programmable hardware element performs the functionality of the graphical program, and the second portion of the configured programmable hardware element performs the fixed functionality.

2. The method of claim 1, wherein the selected at least one pre-defined HCP is configured to implement an interface for a software application executing on a processor coupled to the circuit, and wherein during operation of the circuit, the interface provides an application interface for the software application.

3. The method of claim 1, wherein the selected at least one pre-defined HCP is configured to implement an input/output (I/O) interface for an I/O element coupled to the second portion of the circuit, and wherein during operation of the circuit, the I/O interface provides an interface for the I/O element.

4. The method of claim 1, wherein the selected at least one pre-defined HCP is configured to implement a data acquisition function, and wherein during operation of the circuit, the second portion of the circuit is operable to perform the data acquisition function to acquire data from a physical system.

5. The method of claim 1, wherein the selected at least one pre-defined HCP is configured to implement a data analysis function, and wherein during operation of the circuit, the second portion of the circuit is operable to perform the data analysis function.

6. The method of claim 1, wherein the at least one graphical program specifies a data acquisition function, and wherein during operation of the circuit, the first portion of the circuit is operable to perform the data acquisition function to acquire data from a physical system.

7. The method of claim 1, wherein the at least one graphical program specifies a data analysis function, and wherein during operation of the circuit, the first portion of the circuit is operable to perform the data analysis function.

8. The method of claim 1, wherein the at least one graphical program specifies a data analysis function, and wherein the at least one pre-defined HCP is configured to implement a data acquisition function, and wherein during operation of the circuit, the first portion of the circuit is operable to analyze data acquired by the second portion of the circuit.

9. The method of claim 1, wherein the at least one graphical program specifies a data acquisition function, and wherein the at least one pre-defined HCP is configured to implement a data analysis function, and wherein during operation of the circuit, the second portion of the circuit is operable to analyze data acquired by the first portion of the circuit.

10. The method of claim 1, wherein the fixed functionality comprises timing and data transfer functionality for one or more of:
the at least one graphical program functionality implemented on the first portion of the circuit;
a software application executing on a processor coupled to the circuit; or
an I/O element coupled to the second portion of the circuit.

11. The method of claim 1, further comprising:
receiving user input configuring one or more aspects of the interface functionality for communicating with the graphical program functionality implemented on the first portion of the circuit, wherein said generating the at least a portion of the netlist is performed in accordance with said configuring the one or more aspects.

12. The method of claim 1, wherein the at least one graphical program implements interface functionality for communicating with a host interface executing on a processor coupled to the circuit, and wherein during operation of the circuit, the first portion of the circuit is operable to communicate with the host interface.

13. The method of claim 1, wherein the at least one graphical program implements interface functionality for communicating with an I/O element coupled to the first portion of the circuit, and wherein during operation of the circuit, the first portion of the circuit is operable to communicate with the I/O element.

14. The method of claim 1, further comprising:
displaying a graphical user interface on a display;
wherein said selecting at least one the graphical program and said selecting the at least one pre-defined HCP comprises receiving user input adding the at least one graphical program and the at least one pre-defined HCP to a portion of the graphical user interface.

15. The method of claim 1, further comprising:
displaying a tree structure on a display;
wherein said selecting the at least one graphical program and said selecting the at least one pre-defined HCP comprises receiving user input adding the at least one graphical program and the at least one pre-defined HCP to the tree structure.

16. The method of claim 15, wherein said receiving user input adding the at least one graphical program and the at least one pre-defined HCP to the tree structure comprises one or more of:
receiving user input dragging and dropping respective icons representing the at least one graphical program and the at least one pre-defined HCP onto the tree structure; or
receiving user input to the tree structure invoking a menu, and receiving user input to the menu selecting the at least one graphical program and the at least one pre-defined HCP from the menu.

17. The method of claim 1, further comprising:
displaying a graphical user interface (GUI) on a display, wherein the GUI includes an image of the circuit;
wherein said selecting the at least one graphical program and said selecting the at least one pre-defined HCP comprises receiving user input adding icons representing the at least one graphical program and the at least one pre-defined HCP to the image of the circuit.

18. The method of claim 1, wherein the circuit comprises an application specific integrated circuit (ASIC), the method further comprising:
sending the netlist to a circuit manufacturer to manufacture the ASIC.

19. A computer accessible memory medium that stores program instructions that are executable to design a circuit, wherein the program instructions are executable by a processor to:
select at least one graphical program in response to user input, wherein the at least one graphical program comprises a plurality of interconnected nodes that visually indicate functionality of the graphical program;
select at least one pre-defined hardware configuration program (HCP) from a plurality of pre-defined HCPs in response to user input, wherein the selected at least one pre-defined HCP specifies a fixed functionality, including interface functionality for communicating with the at least one graphical program when implemented on the circuit;

generate at least a portion of a netlist based on the at least one graphical program and the at least one selected pre-defined HCP;

wherein the netlist is usable to configure a circuit, wherein a first portion of the circuit implements the functionality of the at least one graphical program and a second portion of the circuit implements the fixed functionality, and wherein the circuit comprises a programmable hardware element that includes a programmable gate array;

configure the programmable hardware element based on the netlist to produce a configured programmable hardware element, wherein a first portion of the configured programmable hardware element implements the functionality of the at least one graphical program and a second portion of the configured programmable hardware element implements the fixed functionality;

wherein during operation of the configured programmable hardware element the first portion of the configured programmable hardware element performs the functionality of the graphical program, and the second portion of the configured programmable hardware element performs the fixed functionality.

* * * * *